United States Patent
Bury et al.

(10) Patent No.: US 9,456,518 B2
(45) Date of Patent: Sep. 27, 2016

(54) MODULAR FIELDBUS SYSTEM, CARRIER MODULE AND FIELDBUS MODULE

(71) Applicant: PHOENIX CONTACT GMBH & CO KG, Blomberg (DE)

(72) Inventors: Joachim Bury, Herford (DE); Thomas Salomon, Verl (DE)

(73) Assignee: PHOENIX CONTACT GMBH & CO KG, Blomberg (DE)

( * ) Notice: Subject to any disclaimer, the term of this patent is extended or adjusted under 35 U.S.C. 154(b) by 73 days.

(21) Appl. No.: 14/417,767

(22) PCT Filed: Jul. 25, 2013

(86) PCT No.: PCT/EP2013/065748
§ 371 (c)(1),
(2) Date: Jan. 27, 2015

(87) PCT Pub. No.: WO2014/016384
PCT Pub. Date: Jan. 30, 2014

(65) Prior Publication Data
US 2015/0195944 A1    Jul. 9, 2015

(30) Foreign Application Priority Data
Jul. 27, 2012 (DE) .................. 10 2012 213 281

(51) Int. Cl.
*H05K 7/14*  (2006.01)
(52) U.S. Cl.
CPC .......... *H05K 7/1472* (2013.01); *H05K 7/1469* (2013.01)
(58) Field of Classification Search
CPC .... H05K 7/14; H05K 7/1472; H05K 7/1474; H05K 7/1479; H05K 7/1478; H01R 9/26; H01R 25/00; H01R 13/62; H01R 9/22; G06F 13/00; G06F 13/40
USPC ....... 361/600, 601, 622, 624, 629, 631, 636, 361/637, 728, 729, 732, 725, 740, 759; 439/61, 76.1, 76.2, 121, 153, 155, 439/715–717, 638, 928
See application file for complete search history.

(56) References Cited

U.S. PATENT DOCUMENTS

| | | | | |
|---|---|---|---|---|
| 4,738,632 A | * | 4/1988 | Schmidt | H05K 7/1441 361/729 |
| 4,878,860 A | * | 11/1989 | Matsuoka | H01R 12/7076 439/502 |
| 5,486,116 A | | 1/1996 | Meiler et al. | |
| 5,791,916 A | | 8/1998 | Schirbl et al. | |
| 6,081,048 A | * | 6/2000 | Bergmann | H05K 7/1472 307/147 |
| 6,172,877 B1 | * | 1/2001 | Feye-Hohmann | G06F 1/184 361/728 |
| 6,475,036 B2 | * | 11/2002 | Morikawa | H01R 13/6395 439/716 |

(Continued)

FOREIGN PATENT DOCUMENTS

| DE | 19514767 | 5/1996 |
|---|---|---|
| DE | 20211002 | 12/2002 |

(Continued)

*Primary Examiner* — Michail V Datskovskiy
(74) *Attorney, Agent, or Firm* — Loeb & Loeb LLP

(57) ABSTRACT

The present invention relates to a carrier module (100) for fieldbus modules that can be snapped onto a carrier profile and is movable on the carrier profile, with a first plug connector (101L) for electrically and mechanically connecting a left-side fieldbus module to the carrier module (100) and with a second plug connector (101R) for electrically and mechanically connecting a right-side fieldbus module to the carrier module (100).

26 Claims, 11 Drawing Sheets

(56) References Cited

U.S. PATENT DOCUMENTS

| | | | | |
|---|---|---|---|---|
| 7,397,668 B2 * | 7/2008 | Sekine | | H05K 7/1465 361/728 |
| 7,616,453 B2 * | 11/2009 | Bergmann | | H05K 5/061 361/816 |
| 8,375,986 B2 * | 2/2013 | Miyazoe | | F15B 13/0825 137/560 |
| 9,298,664 B2 * | 3/2016 | Gruber | | G05B 19/0423 |
| 2004/0024939 A1 | 2/2004 | Hoeing et al. | | |
| 2004/0033720 A1 | 2/2004 | Bergner et al. | | |

FOREIGN PATENT DOCUMENTS

| | | |
|---|---|---|
| EP | 0592712 | 4/1994 |
| WO | 0223676 | 3/2002 |

\* cited by examiner

MODULAR FIELDBUS SYSTEM, CARRIER MODULE AND FIELDBUS MODULE

FIELD OF THE INVENTION

The present invention concerns a module fieldbus system with a carrier module and a fieldbus module.

RELATED TECHNOLOGY

The power distribution in fieldbus systems in circuit cabinets often occurs across busbar systems with support function or flying connections with no support function, such as distribution combs or wire connections. A signal distribution occurs, for example, along control lines and device connecting terminals or bus lines with plug connectors or device connecting terminals. The functional distribution occurs through individual fieldbus modules, which are ranged alongside each other in individual housings and wired together.

Outside a circuit cabinet, the power distribution occurs through lines and plug systems without supporting function, separated into low and extra low voltage. The signal distribution occurs by bus lines with plug connectors or device connecting terminals. The functional distribution occurs, specific to application, in housings which are combined with each other.

Patent DE 20 211 002 U1 concerns a fieldbus module for an electrical device with a base module unit, which can be screwed to a base, such as a machine. The base module unit can be ranged alongside other base module units like a chain. A connecting unit can be placed on each of the base module units. In this system, a fitting base module unit is required for each connecting unit with a particular width. This increases the number of components in the system.

SUMMARY

Therefore, the objective of the present invention is to provide a modular fieldbus system which can be assembled with a small number of different individual components in a simple technical manner.

This objective is achieved by the subject matters with the features of the independent claims. Advantageous embodiments are the subject matter of the dependent claims, the specification, and the drawings.

According to a first aspect, the aforementioned objective is achieved by a carrier module for fieldbus modules that can be snapped onto a carrier profile and moved on the carrier profile, with a first plug connector for the electrical and mechanical fastening of a first, e.g., left-side fieldbus module to the carrier module and a second plug connector for the electrical and mechanical connection of a second, e.g., right-side fieldbus module to the carrier module. The carrier module achieves the advantage that an extensible chain of fieldbus modules can be accomplished, whose stability is assured by the profile rail. The chain forms a self-constructed bus whose length can be scaled and adapted to the application requirements. Fieldbus modules of different width can be ranged alongside each other across the same carrier module. The direction of expansion of the system can occur in both directions along the rail.

In one advantageous embodiment of the carrier module the first plug connector comprises a first low voltage plug connector, a first extra low voltage plug connector and a first data plug connector and the second plug connector comprises a second low voltage plug connector, a second extra low voltage plug connector and a second data plug connector. This achieves the technical advantage, for example, that a self-constructing bus can be formed for the three functions—primary power, auxiliary power, and data. Moreover, the usual manual wiring of control signals and data bus, auxiliary power and primary power is not needed. Excess lengths of power supply buses and cables used for the wiring can be spared.

In another advantageous embodiment of the carrier module the first low voltage plug connector, the first extra low voltage plug connector and the first data plug connector are arranged in a first row on a first side of the carrier module and the second low voltage plug connector, the second extra low voltage plug connector and the second data plug connector are arranged in a second row on a second side of the carrier module. This accomplishes the technical advantage, for example, that an electrical and mechanical connection between the carrier module and the fieldbus modules can be produced in easy fashion. In addition, with such an arrangement the of the plug connector, the carrier module can be narrow in embodiment.

In another advantageous embodiment of the carrier module the carrier module comprises a detent opening for inserting a locking shaft, in order to secure a fieldbus module on the carrier module. This accomplishes the technical advantage, for example, that the fieldbus module can be reliably fastened to the carrier module.

In another advantageous embodiment of the carrier module the carrier module comprises a first and a second detent opening for a left-side fieldbus module and a first and a second detent opening for a right-side fieldbus module. This accomplishes the technical advantage, for example, that both a right-side and a left-side fieldbus module can be reliably fastened to the carrier module.

In another advantageous embodiment of the carrier module the carrier module has a rectangular base area in cross section and the first detent opening for the left-side fieldbus module is arranged in a first corner, the second detent opening for the left-side fieldbus module is arranged in a second corner, the first detent opening for the right-side fieldbus module is arranged in a third corner and the second detent opening for the right-side fieldbus module is arranged in a fourth corner. This accomplishes the technical advantage, for example, that an especially stable securing of both fieldbus modules on the carrier module is achieved.

According to a second aspect, the aforementioned objective is achieved by a fieldbus module for snapping onto a left-side carrier module and a right-side carrier module, which are arranged on a carrier profile, with a first plug connector for the electrical and mechanical connection of the fieldbus module to the right-side carrier module and a second plug connector for the electrical and mechanical connection of the fieldbus module to the left-side carrier module. The embodiment of the fieldbus module accomplishes the advantage that by using the carrier module which can move on the profile rail, a chain of fieldbus modules of arbitrary extensible length can be constructed, whose stability is ensured by the profile rail. Fieldbus modules of different width can be placed in a row on the same carrier module. The direction of construction of the system can occur in either direction along the rail.

In one advantageous embodiment of the fieldbus module the first plug connector comprises a first low voltage plug connector, a first extra low voltage plug connector and a first data plug connector and the second plug connector comprises a second low voltage plug connector, a second extra low voltage plug connector and a second data plug connector. This likewise accomplishes the technical advantage, for example, that a self-constructing bus can be formed for the three functions—main power, auxiliary power, and data.

In another advantageous embodiment of the fieldbus module the low voltage plug connector, the first extra low voltage plug connector and the first data plug connector are arranged in a first row on a first side of the fieldbus module and the second low voltage plug connector, the second extra low voltage plug connector and the second data plug connector are arranged in a second row on a second side of the fieldbus module. This accomplishes the technical advantage, for example, that an electrical and mechanical connection can be formed in easy fashion between the carrier module and the fieldbus modules.

In another advantageous embodiment of the fieldbus module the fieldbus module comprises a locking shaft for inserting into a detent opening in the carrier module, in order to secure the fieldbus module on the carrier module. The locking shaft can be movable along its lengthwise axis. In addition, the locking shaft can be spring-loaded. This likewise accomplishes the technical advantage, for example, that the fieldbus module can be reliably fastened to the carrier module.

In another advantageous embodiment of the fieldbus module the fieldbus module comprises a first locking shaft and a second locking shaft for a left-side carrier module and a first locking shaft and a second locking shaft for a right-side carrier module. This likewise accomplishes the technical advantage, for example, that both a right-side and a left-side fieldbus module can be reliably fastened to the carrier module.

In another advantageous embodiment of the fieldbus module the fieldbus module has a rectangular base area in cross section and the first locking shaft for the left-side carrier module is arranged in a first corner, the second locking shaft for the left-side carrier module is arranged in a second corner, the first locking shaft for the right-side carrier module is arranged in a third corner and the second locking shaft for the right-side carrier module is arranged in a fourth corner. This accomplishes the technical advantage, for example, that an especially stable securing of the two fieldbus modules to the carrier module is accomplished.

In another advantageous embodiment of the fieldbus module the locking shaft can be rotated by a locking lever between a release position to release the fieldbus module and a locking position to lock the fieldbus module. This accomplishes the technical advantage, for example, that the fieldbus module can be secured in simple manner by rotating a locking lever.

According to a third aspect, the aforementioned objective is achieved by a modular fieldbus system with a carrier module according to the first aspect and a fieldbus module according to the second aspect. This accomplishes the technical advantage that a flexible system is provided for increasing the length of a bus and components can be formed as much as possible from repeating parts.

According to a fourth aspect, the aforementioned objective is achieved by a carrier module according to the first aspect and a first and a second fieldbus module according to the second aspect, wherein the carrier module can produce a spacing between the first fieldbus module and the second fieldbus module, in order to enable an air convection between the first fieldbus module and the second fieldbus module. This accomplishes the technical advantage, for example, that the fieldbus modules can also be cooled by air flowing past in the diametrically opposite spacing.

BRIEF DESCRIPTION OF THE DRAWINGS

Further configurations will be explained making reference to the enclosed drawings. There are shown.

DETAILED DESCRIPTION

Figure 1:
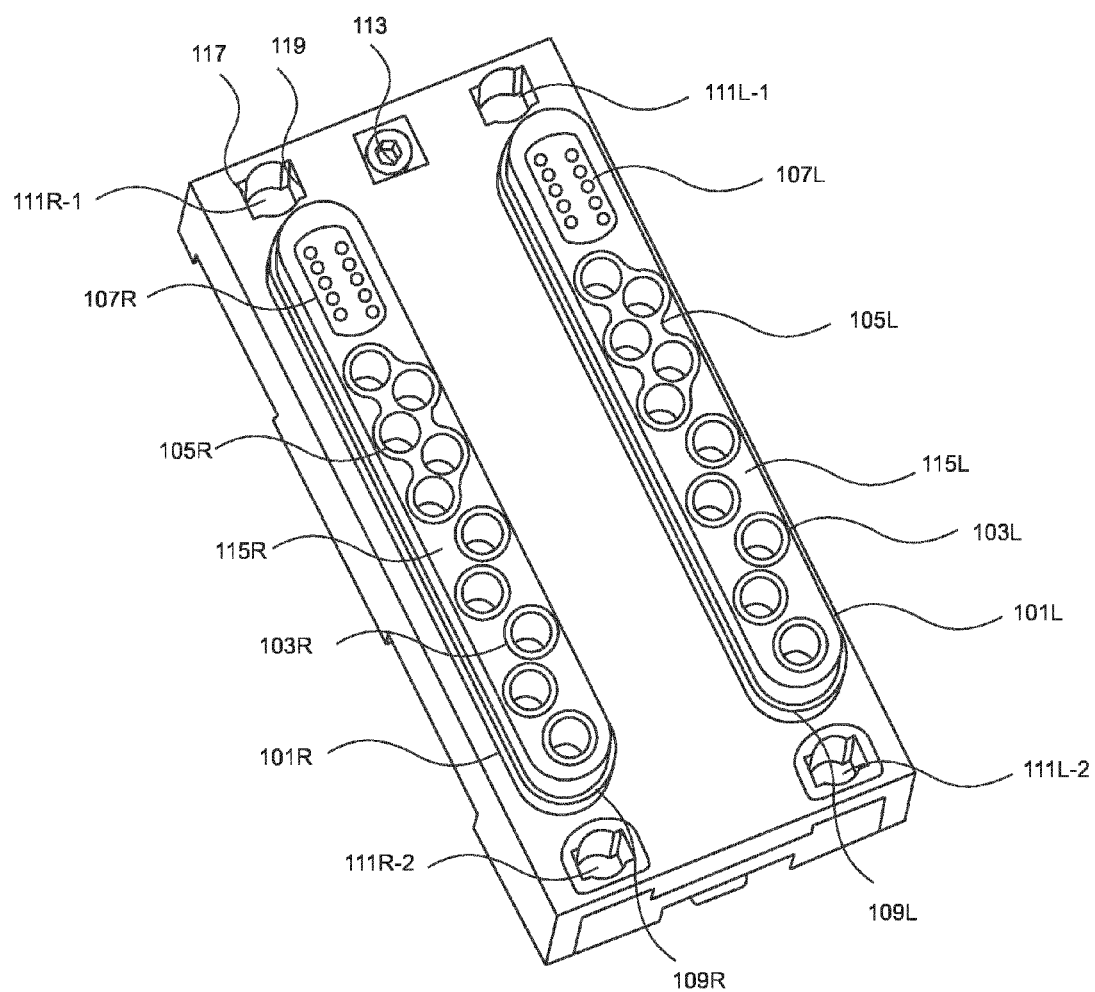
FIG. 1 a view of a carrier module.

FIG. 1 shows a view of a carrier module 100 for fieldbus modules. The carrier module 100 serves as a supporting and connecting element and can pivot on a carrier profile, such as a metal rail, be locked with a latching slide, after which it can still be displaced. After reaching its end position, the carrier module 100 can be secured with a screw 113 at the side. The carrier module 100 together with the individual fieldbus modules which can be mounted on the carrier module forms a self-constructing station bus with cross-connected lifelines.

The carrier module 100 comprises a first plug connector 101L for the electrical and mechanical connecting of a left-side fieldbus module to the carrier module 100 and a second plug connector 101R for the electrical and mechanical connecting of a right-side fieldbus module to the carrier module 100. The first and the second plug connector 101L and 101R each comprise a low voltage plug connector 103L and 103R for a low voltage (5-pole), an extra low voltage plug connector 105L and 105R for an extra low voltage (5-pole) and a data plug connector 107L and 107R for data (10-pole). In this way, it is possible to construct a bus with the functions of main power, auxiliary power, and data.

The first low voltage plug connector 103L, the first extra low voltage plug connector 105L and the first data plug connector 107L are arranged in a vertical row 109L on a first side of the carrier module 100. The second low voltage plug connector 103R, the second extra low voltage plug connector 105R and the second data plug connector 107R are arranged in a second row 109R on a second side of the carrier module 100. The first row 109L and the second row 109R are arranged parallel to each other.

The first and the second plug connector 101L and 101R thus each comprise three contact sets in a linear contact holder. The first contact set comprises, for example, five contacts with a cross section of 10 mm2 for an alternating voltage of 690 V, the second contact set comprises for example five contacts with a cross section of 6 mm2 for a d.c. voltage of 100 V and the third contact set comprises for example ten contacts with a cross section of 0.14 mm2 for a voltage of 40 V for data. In this way, a power distribution of 2×5-poles can be constructed for 400 V/24 V up to 10 mm2.

In the respective contact sets there are installed elastomer bodies 115L and 115R, serving as protection against contact, which seal off the contact set and form a resilient abutment for the locking process. Each elastomer body seals off both radially and axially and can be replaced by the user.

Between any two carrier modules 100 it is possible to mount fieldbus modules, which are snapped into place with a mechanical guide and a corresponding left and right-side plug connector onto a left and right carrier module 100.

The mechanical connection between the carrier modules 100 and the fieldbus modules occurs each time via two detent openings 111L-1, 111L-2, 111R-1 and 111R-2 at the top and bottom of the first and the second plug connectors 101L and 101R. Corresponding locking shafts can be inserted into the detent openings 111 L-1, 111 L-2, 111 R-1 and 111 R-2, starting from the respective fieldbus module, with cross bars which lock upon one rotation in the detent openings 111 L-1, 111 L-2, 111 R-1 and 111 R-2. The detent openings 111 L-1, 111 L-2, 111 R-1 and 111 R-2 have a beveled inner side, in order to assist the inserting of the locking shaft. The cross bar of the locking shaft is led through two side recesses 117 and 119 inside the detent openings 111 L-1, 111 L-2, 111 R-1 and 111 R-2.

In this way, a fastening and locking of the fieldbus module on the carrier element 100 is achieved. The four detent openings 111 L-1, 111 L-2, 111 R-1 and 111 R-2 are arranged in the individual corners of the carrier module 100.

Figure 2:
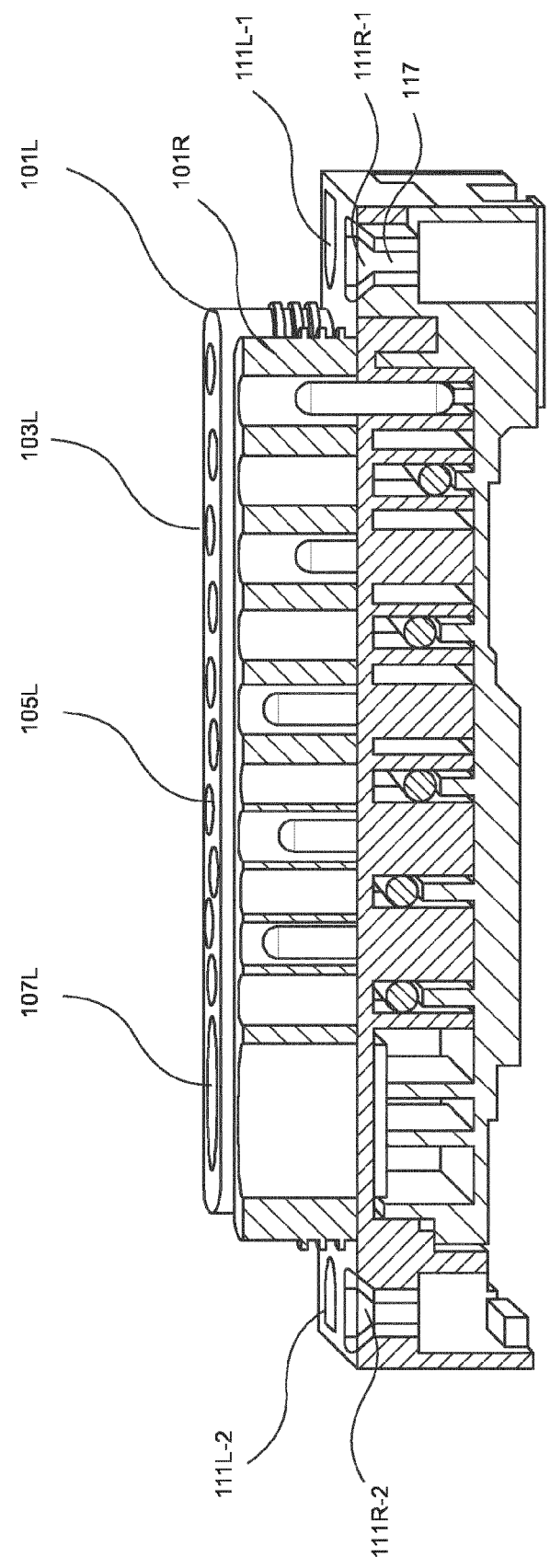
FIG. 2 a cross-sectional view through the carrier module.

FIG. 2 shows a cross sectional view through the carrier module 100. After one rotation of 90°, the cross bar reaches underneath the carrier module 100, so that the mechanical connection is locked.

Figure 3:
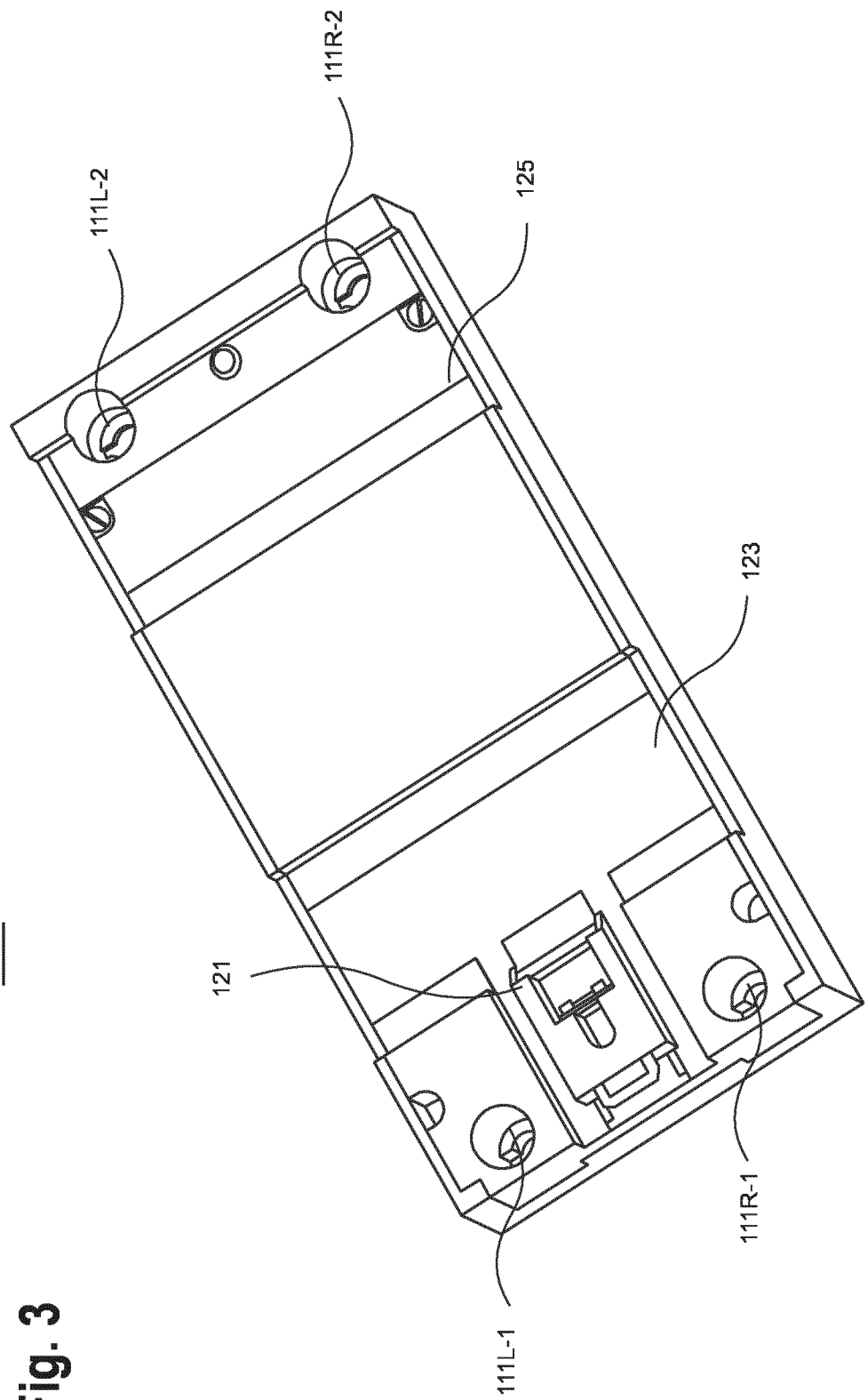
FIG. 3 a rear view of a base plate of the carrier module.

FIG. 3 shows a rear view of a base plate of the carrier module 100. The rear side of the carrier module 100 comprises two recesses 123 and 125, in which a top and a bottom carrier profile travel when the carrier module 100 is set in place. The carrier module 100 comprises a locking device 121 for locking the carrier module on the carrier profile. After being locked on the carrier profile, the carrier module 100 can further move sideways along the carrier profile.

Figure 4:
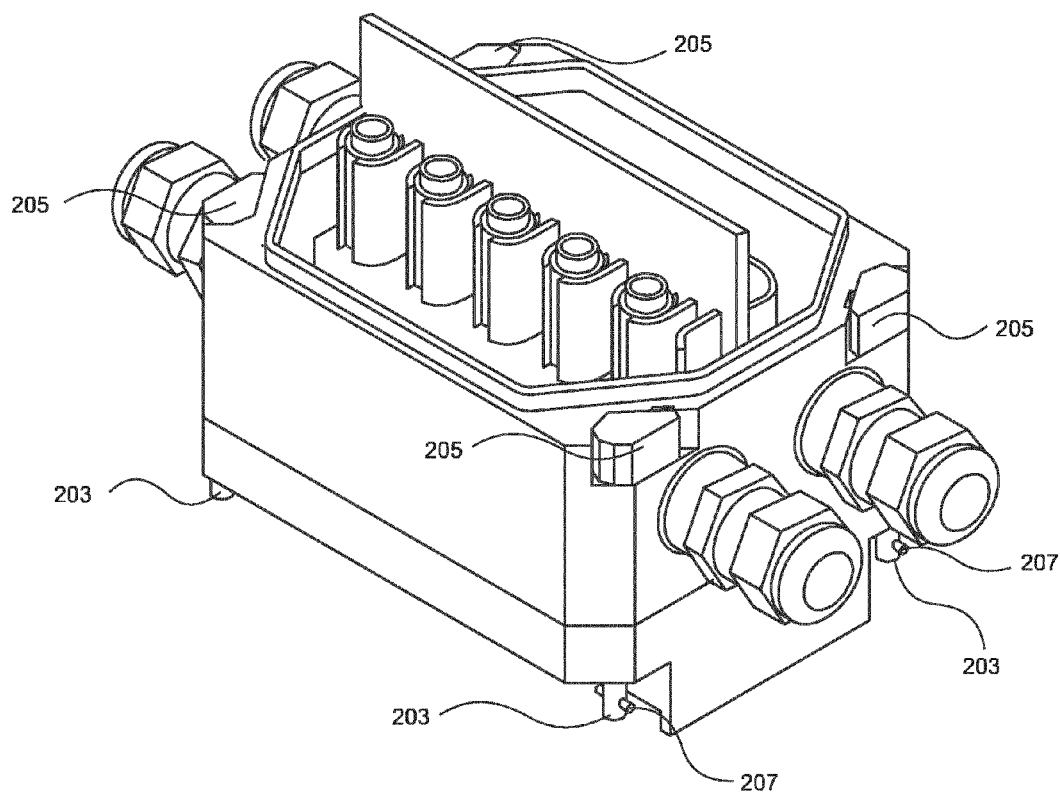
FIG. 4 a view of a fieldbus module.

FIG. 4 shows a view of a fieldbus module 200. The fieldbus module 200 is lined up in and joined to the system by suspending, pivoting or inserting into a left carrier module 100. Another right carrier module 100 is shoved onto the carrier profile in a suitable position, so that the fieldbus module 200 can be set in place on the right carrier module 100. After this, the fieldbus module 200 is fastened with the aid of the four locking levers 205 on the left and the right carrier module 100.

For this purpose, the locking levers 205 of the fieldbus module 200 are turned 90° before being mounted, so that the cross bars 207 of the locking shafts 203 are fitted together for the joint. After the fieldbus module 200 is assembled with the carrier module 100, the locking levers 203 are again turned back 90°. In this way, the contact sets of the carrier module 100 and the fieldbus module 200 are connected firmly with force locking.

Figure 5:
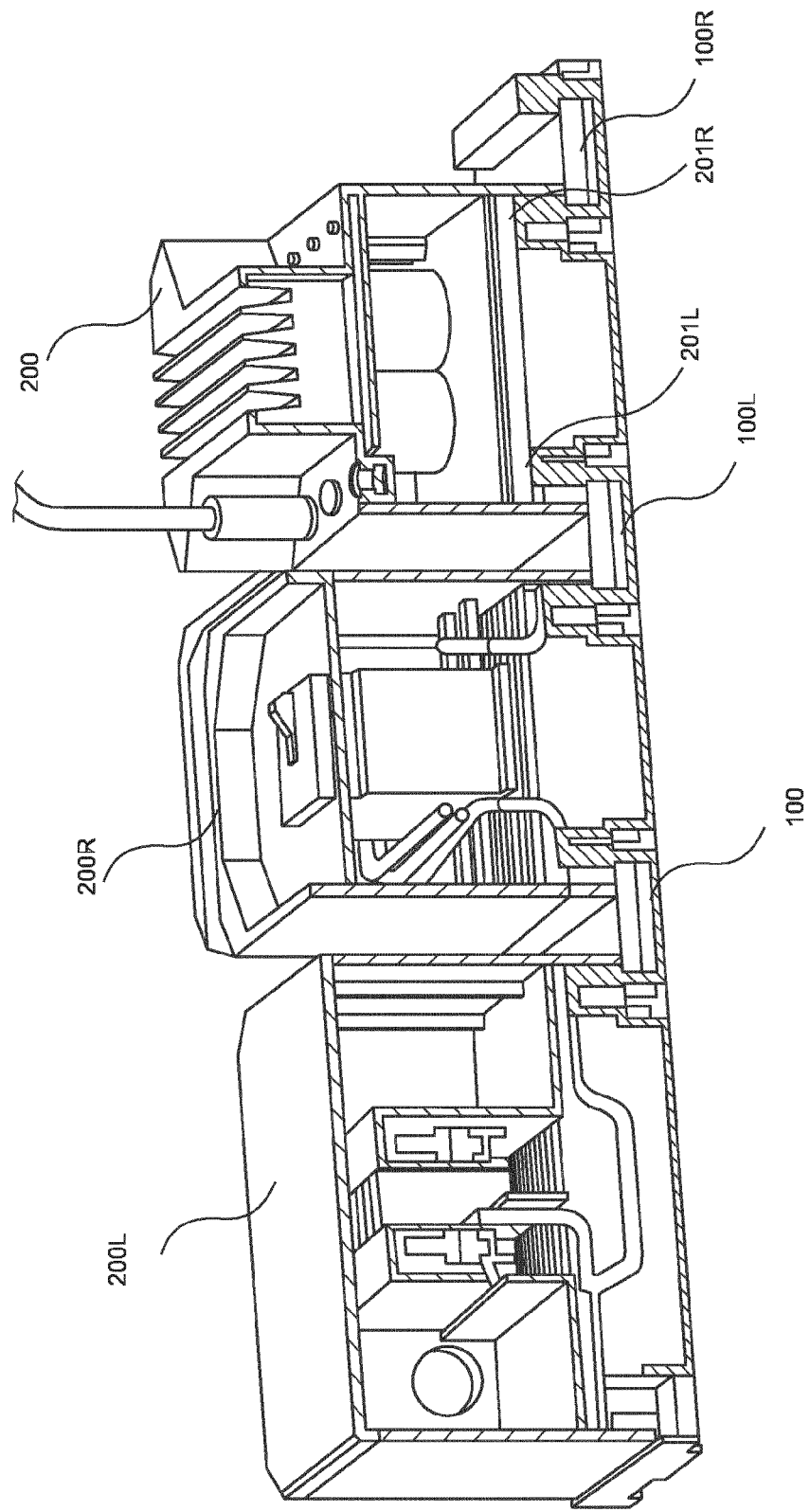
FIG. 5 a cross-sectional view through several carrier modules with different fieldbus modules mounted on them.

FIG. 5 shows a cross sectional view through several carrier modules 100L and 100R with different fieldbus modules 200L and 200R set in place and an internal running of the life lines. The fieldbus module 200R is mounted with a first plug connector 201L on a left-side carrier module 100L and with a second plug connector 201R on a right-side carrier module 100R.

The carrier modules 100 and the fieldbus modules 200 thus form a chain, whose stability is assured by the carrier profile not shown in FIG. 5 and which forms a self-constructing bus. The length of the bus can be scaled by the modular design and adapted to the application requirements. Thanks to the symmetrical arrangement of the first and the second plug connectors 101L and 101R of the carrier module 100, the direction of construction of the system can be to the left and the right.

All internal electrical connections are made by the making of the mechanical connection between the carrier module 100 and the fieldbus module 200. A system tool may be needed to loosen lock slides and fixation screws, for example, a 6 mm screw driver.

Figure 6:
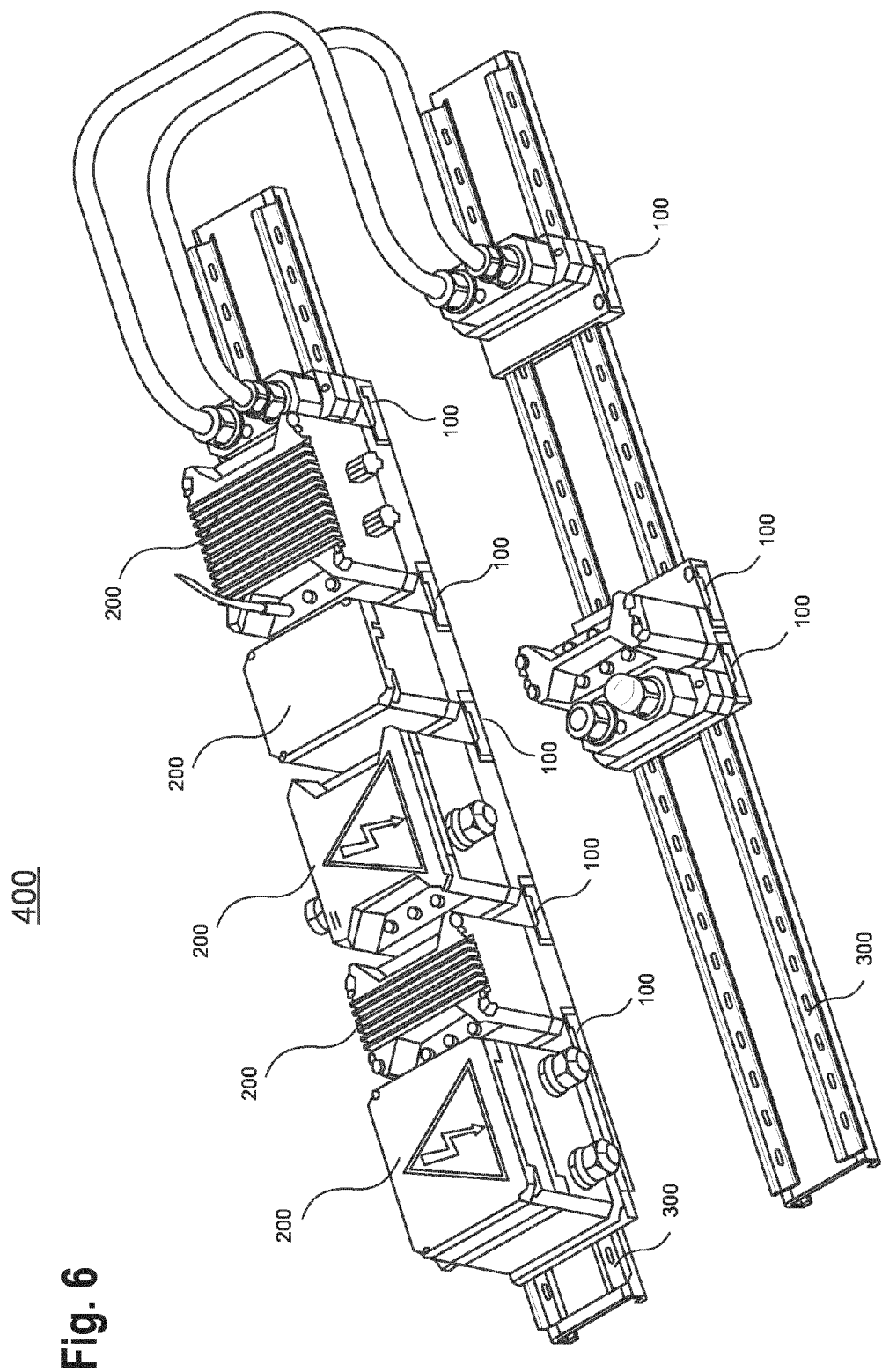
FIG. 6 a perspective view of the modular fieldbus system.

FIG. 6 shows a perspective view of the modular fieldbus system 400. The modular fieldbus system 400 comprises the fieldbus modules 200 and the carrier modules 100, which are locked on the carrier profile 300. The carrier profile 300 is formed by two support rails, such as profile rails made from rigid metal beams or a rolled steel profile. The top edge of the carrier profile 300 bears the load of the carrier modules 100 and the fieldbus modules 200.

After being locked on, the carrier modules 100 can be shifted. Once the carrier modules 100 are in the designated position on the carrier profile 300, they are finally locked, for example, by the fixation screw 113.

For purposes of cooling, after the assembly is done a spacing of 20 mm for example can be provided between the fieldbus modules 200, in order to enable a convection between opposite side walls. The field stations are joined into a network via the fieldbus modules 200.

Figure 7:
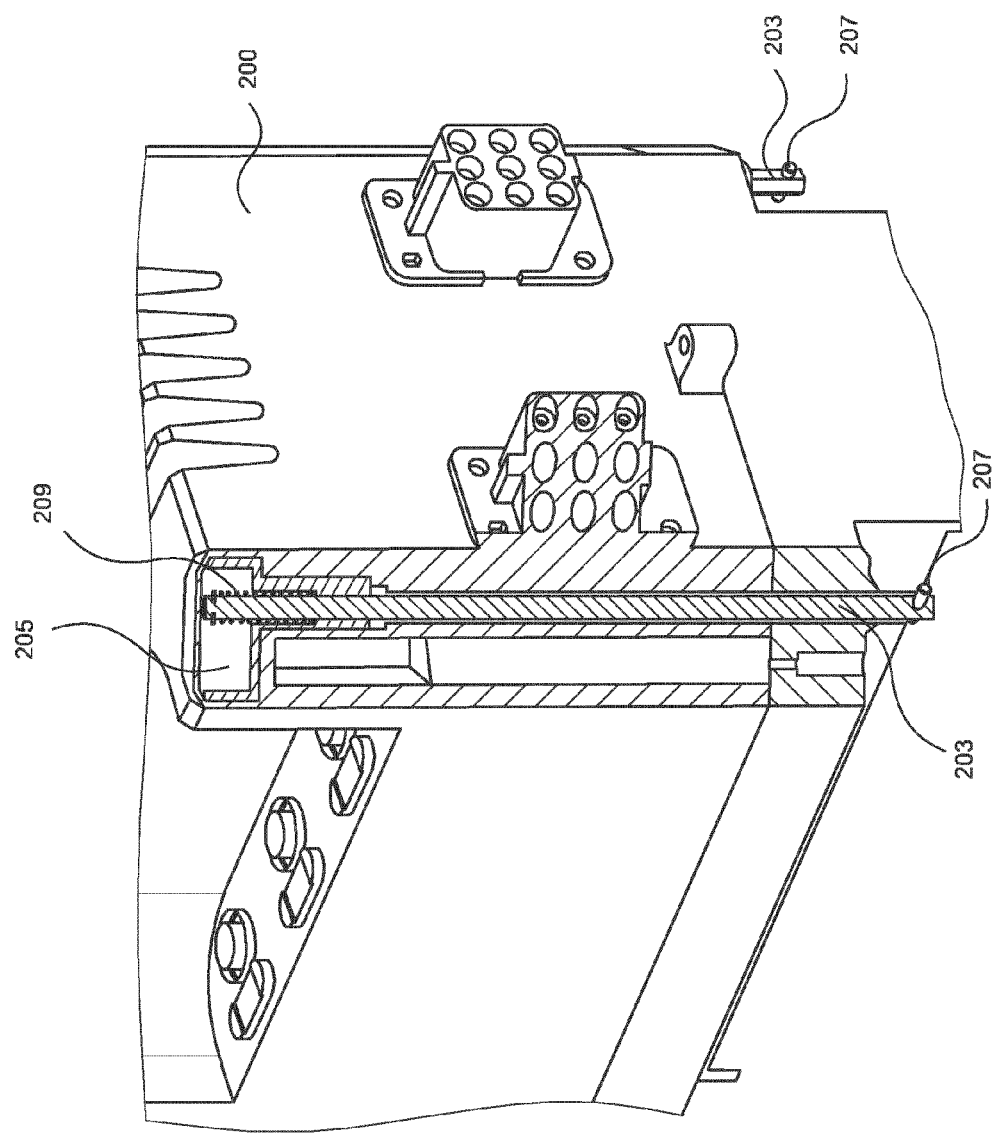
FIG. 7 a cross-sectional view through a locking lever and a locking shaft in a fieldbus module.

FIG. 7 shows a cross sectional view through a locking lever 205 and a locking shaft 203 in a fieldbus module 200. The locking lever 205 is arranged in one corner of a housing of the fieldbus module 200 and is accessible from the front side of the fieldbus module 200 and can be activated by the user. The locking shaft 203 extends inside the housing and runs from the locking lever 205 to the back side of the fieldbus module 200. On the back side of the fieldbus module 200, the locking shaft 203 protrudes, so that it can be introduced into the provided detent opening 111. A turning of the locking lever 205 is transmitted to the rotary locking shaft 203. After the locking shaft 203 is inserted into the detent opening 111 of the carrier module 100, the fieldbus module 200 can be locked on the carrier module 100 by the turning of the locking shaft 203. In this process, the cross bar 207 reaches underneath a front plate of the carrier module 100.

The locking shaft 203 can also be displaced along its lengthwise axis and is loaded with a force by the spring 209. Thanks to the spring force, the fieldbus module 200 is pressed via the locking lever 205 onto the carrier module 100. Due to the movable suspension of the locking shaft 203 relative to the locking lever 205, a jamming or a blocking of the locking shaft 203 can be prevented during the inserting and turning process.

The housing comprises four locking levers 205, which are arranged in the corners of the housing and each of which serves for the locking of the fieldbus module 200 on a right-side or left-side carrier module 100. The locking levers 205 can be set into corresponding recesses in the housing and form with it a smooth, form-fitting contour. The locking levers 205 are thus taken up in the housing of the fieldbus modules 200 and continue the housing contour seamlessly with beveled corners and facets. On the other hand, when there is no locking of the fieldbus module 200 the locking levers 205 stick out transversely to the housing and signal an incomplete assembly process.

The finding of the fieldbus module 200 when being lowered onto the carrier modules 100L and 100R is mechanically assisted by the plug connectors 101L, 101R, 201L and 201R. The insertion forces are reduced to a third by three staggered levels (leading) of the contact sets. The forces to pull out the fieldbus module 200 can be assisted by a simple tool.

Figure 8:
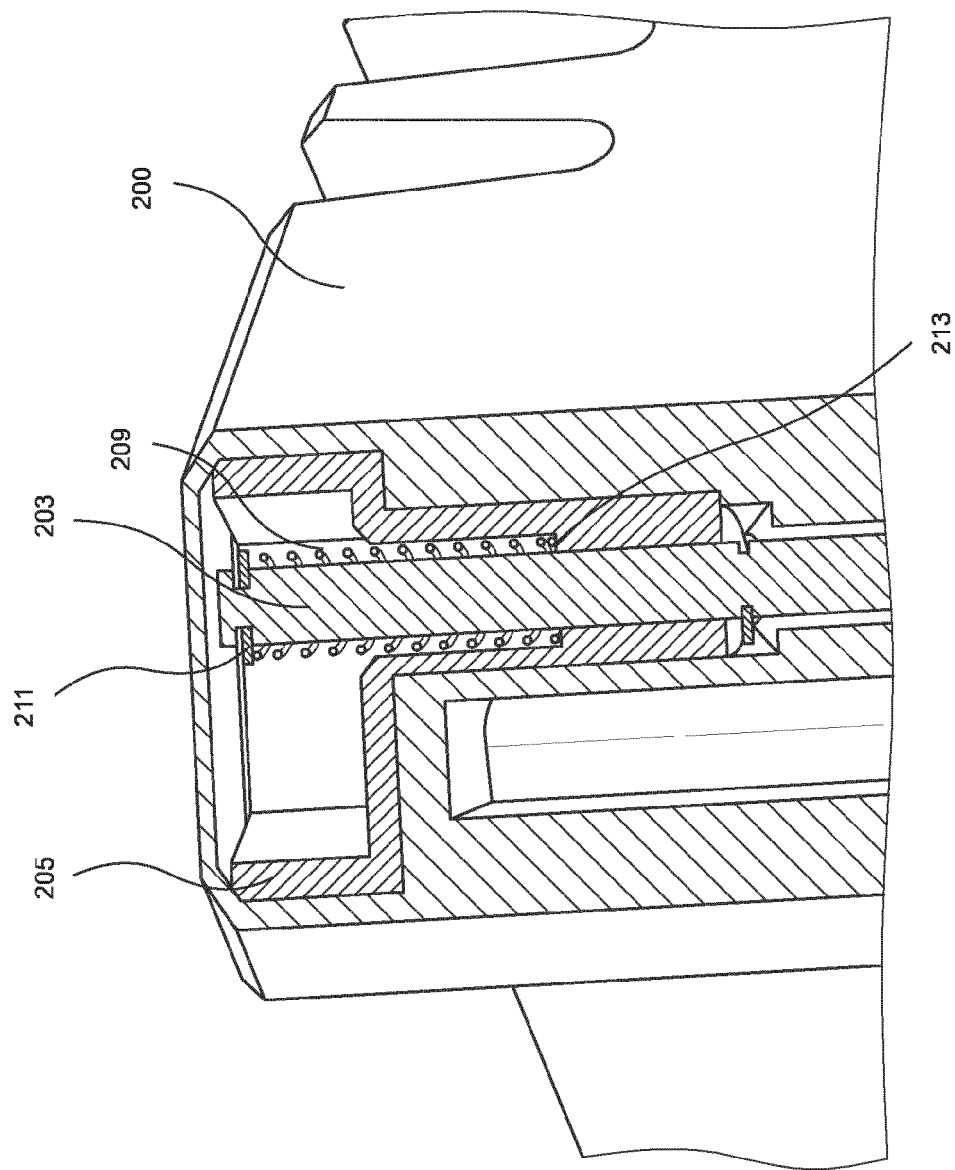
FIG. 8 a cross-sectional view through the locking lever in the fieldbus module.

FIG. 8 shows a cross sectional view through the locking lever 205 in the fieldbus module 200. The locking shaft 203 is movably mounted inside the locking lever 205 and loaded by the spring 209 with a force which pulls the locking shaft 203 into the housing of the fieldbus module 200. The spring 209 is located in a cavity inside the locking lever 205 and lies on one side against an edge 213 inside the locking lever 205 and on the other side against a washer 211 encircling the locking shaft 203.

Figure 9:
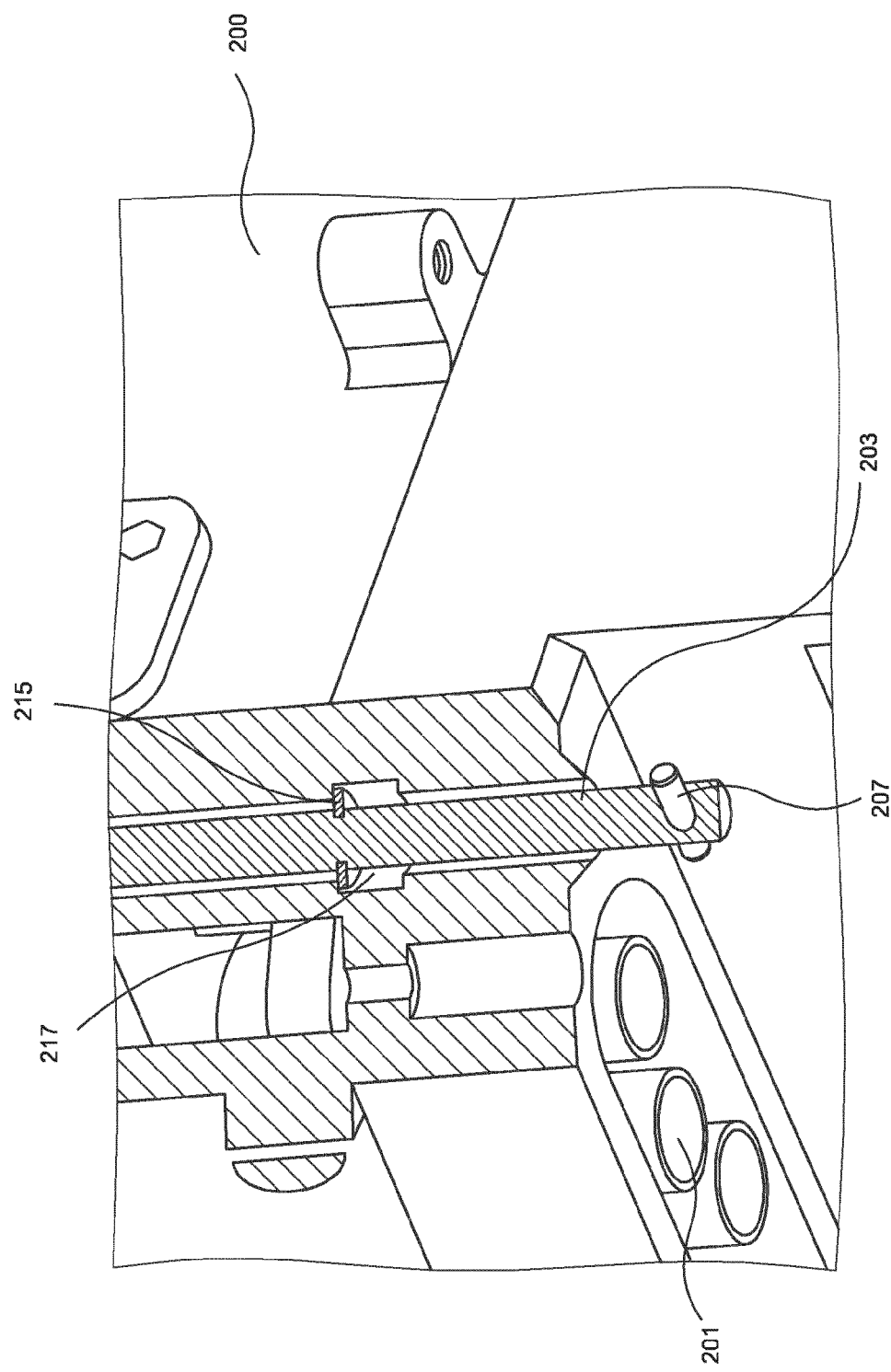
FIG. 9 a cross-sectional view through the locking shaft in the fieldbus module.

FIG. 9 shows a cross sectional view through the locking shaft 203 in the fieldbus module 200 at its lower end. The locking shaft 203 protrudes at the back side of the fieldbus module 200 and is arranged at the side of the plug connector 201 of the fieldbus module 200. To limit a displacement of the locking shaft 203 along its lengthwise axis, the locking shaft 203 comprises an encircling ring plate 215. The ring plate 215 is arranged in a cavity 217 inside the housing and limits the movement of the locking shaft 203 in that it strikes against the top or bottom end of the cavity 217.

Figure 10:
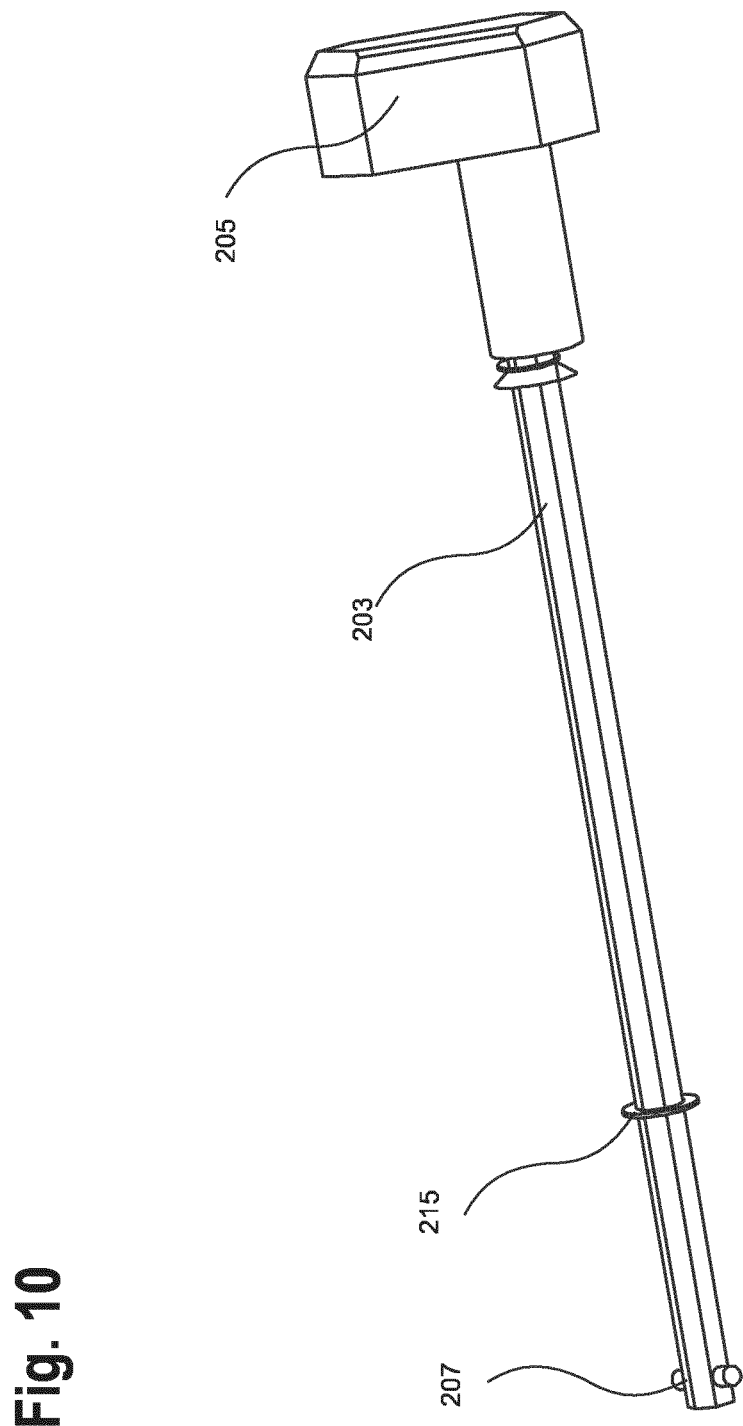
FIG. 10 a view of the locking lever without fieldbus module.

FIG. 10 shows a view of the locking lever 205 without fieldbus module 200. The locking shaft 203 is formed by a hexagonal profile. The cross bar 207 sticks out at the side at the lower end from the locking shaft 203.

Figure 11:
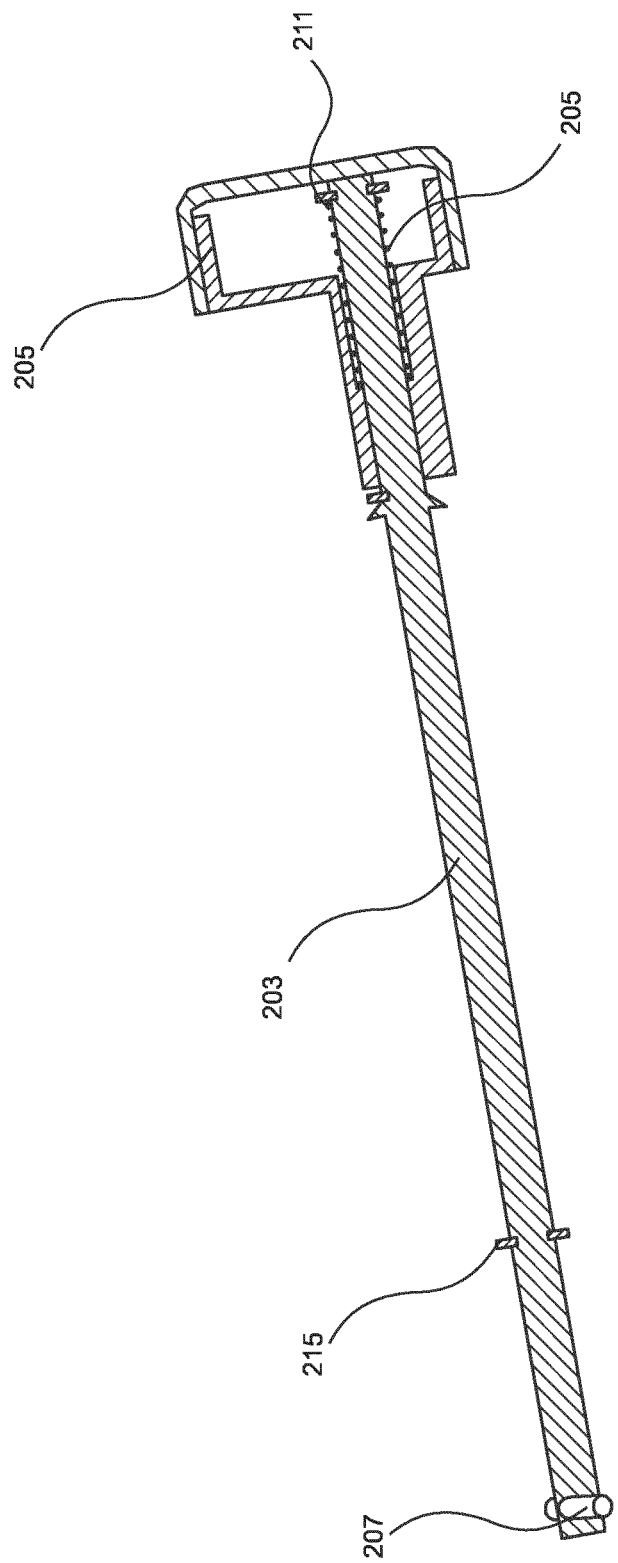
FIG. 11 a cross-sectional view through the locking lever without fieldbus module.

FIG. 11 shows the cross sectional view through the locking lever 205 without fieldbus module 200 corresponding to FIG. 10. The spring 209 is arranged inside the locking lever 205.

The embodiment of the fieldbus modules according to the invention makes possible a linear two-sided connection of devices of any desired length. The construction of the fieldbus system occurs intuitively, so that the qualifications when putting it together can be reduced to the level of a mechanic. This can significantly reduce the labor expense for a commissioning and troubleshooting. The advantages of a simple commissioning can therefore also be enjoyed during complex circuit cabinet installations.

The invention makes possible a modular fieldbus system, which can be assembled intuitively. All electrical connections are made at the same time as the mechanical assembly. It can be used inside or outside a circuit cabinet. The modular fieldbus system constitutes a wiring-free device construction system which meets the IP20 to IP6x requirements. In addition, the modular fieldbus system enables a simple hook-up as nodes in a power distribution system of any given structure, such as line, tree, ring or network.

The modular fieldbus system can be used, for example, in modular field stations per IP6x requirements, circuit cabinets, switchboxes, or machine bases. The invention can be used to set up low and very low voltage distributions or to set up modular or distributed field stations in an automation network. In general, the invention can be used for switching, relays, control and regulation of energy consumers.

All features explained and illustrated in connection with individual embodiments of the invention can be provided in various combination in the subject matter of the invention, in order to realize its advantageous effects at the same time.

The scope of protection of the present invention is given by the claims and not limited by the features explained in the specification or shown in the figures.

LIST OF REFERENCE SYMBOLS

100 Carrier module
100L Left-side carrier module
100R Right-side carrier module
101L First plug connector
101R Second plug connector
103L Low voltage plug connector
103R Low voltage plug connector
105L Extra low voltage plug connector
105R Extra low voltage plug connector
107L Data plug connector
107R Data plug connector
109L First row
109R Second row
111L-1 Detent opening
111L-2 Detent opening
111R-1 Detent opening
111R-2 Detent opening
113 Screw
115L Elastomer body
115R Elastomer body
117 Recess
119 Recess
121 Locking device
123 Recess
125 Recess
200 Fieldbus module
200L Fieldbus module
200R Fieldbus module
201L First plug connector
201R Second plug connector
203 Locking shaft
205 Locking lever
207 Cross bar
209 Spring
211 Washer
213 Edge
215 Ring plate
217 Cavity
300 Carrier profile
400 Modular fieldbus system

The invention claimed is:

1. Carrier module for fieldbus modules that can be snapped onto a carrier profile and moved on the carrier profile, with:
    a first plug connector for the electrical and mechanical fastening of a left-side fieldbus module to the carrier module; and
    a second plug connector for the electrical and mechanical connection of a right-side fieldbus module to the carrier module.

2. Carrier module according to claim 1, wherein the first plug connector comprises a first low voltage plug connector, a first extra low voltage plug connector and a first data plug connector and the second plug connector comprises a second low voltage plug connector, a second extra low voltage plug connector and a second data plug connector.

3. Carrier module according to claim 2, wherein the low voltage plug connector, the first extra low voltage plug connector and the first data plug connector are arranged in a first row on a first side of the carrier module and the second low voltage plug connector, the second extra low voltage plug connector and the second data plug connector are arranged in a second row on a second side of the carrier module.

4. Carrier module according to claim 1, wherein the carrier module comprises a detent opening for inserting a locking shaft, in order to secure a fieldbus module on the carrier module.

5. Carrier module according to claim 4, wherein the carrier module comprises a first and a second detent opening for a left-side fieldbus module and a first and a second detent opening for a right-side fieldbus module.

6. Carrier module according to claim 5, wherein the carrier module has a rectangular base area in cross section and the first detent opening for the left-side fieldbus module is arranged in a first corner, the second detent opening for the left-side fieldbus module is arranged in a second corner, the first detent opening for the right-side fieldbus module is arranged in a third corner and the second detent opening for the right-side fieldbus module is arranged in a fourth corner.

7. Fieldbus module for snapping onto a left-side carrier module and a right-side carrier module, which are arranged on a carrier profile, with:
a first plug connector for the electrical and mechanical connection of the fieldbus module to the right-side carrier module; and
a second plug connector for the electrical and mechanical connection of the fieldbus module to the left-side carrier module.

8. Fieldbus module according to claim 7, wherein the first plug connector comprises a first low voltage plug connector, a first extra low voltage plug connector and a first data plug connector and the second plug connector comprises a second low voltage plug connector, a second extra low voltage plug connector and a second data plug connector.

9. Fieldbus module according to claim 8, wherein the low voltage plug connector, the first extra low voltage plug connector and the first data plug connector are arranged in a first row on a first side of the fieldbus module and the second low voltage plug connector, the second extra low voltage plug connector and the second data plug connector are arranged in a second row on a second side of the fieldbus module.

10. Fieldbus module according to claim 7, wherein the fieldbus module comprises a locking shaft for inserting into a detent opening in the carrier module, in order to secure the fieldbus module on the carrier module.

11. Fieldbus module according to claim 10, wherein the fieldbus module comprises a first locking shaft and a second locking shaft for a left-side carrier module and a first locking shaft and a second locking shaft for a right-side carrier module.

12. Fieldbus module according to claim 11, wherein the fieldbus module has a rectangular base area in cross section and the first locking shaft for the left-side carrier module is arranged in a first corner, the second locking shaft for the left-side carrier module is arranged in a second corner, the first locking shaft for the right-side carrier module is arranged in a third corner and the second locking shaft for the right-side carrier module is arranged in a fourth corner.

13. Fieldbus module according to claim 10, wherein the locking shaft can be rotated by a locking lever between a release position to release the fieldbus module and a locking position to lock the fieldbus module.

14. Modular fieldbus system comprising:
a carrier module for fieldbus modules that can be snapped onto a carrier profile and moved on the carrier profile, with:
a first plug connector for the electrical and mechanical fastening of a left-side fieldbus module to the carrier module, and
a second plug connector for the electrical and mechanical connection of a right-side fieldbus module to the carrier module; and
a fieldbus module for snapping onto a left-side carrier module and a right-side carrier module, which are arranged on a carrier profile, with:
a first plug connector for the electrical and mechanical connection of the fieldbus module to the right-side carrier module, and
a second plug connector for the electrical and mechanical connection of the fieldbus module to the left-side carrier module.

15. Modular fieldbus system according to claim 14, wherein the carrier module can produce a spacing between the first fieldbus module and the second fieldbus module, in order to enable an air convection between the first fieldbus module and the second fieldbus module.

16. Modular fieldbus system according to claim 14, wherein the first plug connector comprises a first low voltage plug connector, a first extra low voltage plug connector and a first data plug connector and the second plug connector comprises a second low voltage plug connector, a second extra low voltage plug connector and a second data plug connector.

17. Modular fieldbus system according to claim 16, wherein the low voltage plug connector, the first extra low voltage plug connector, and the first data plug connector are arranged in a first row on a first side of the carrier module and the second low voltage plug connector, the second extra low voltage plug connector and the second data plug connector are arranged in a second row on a second side of the carrier module.

18. Modular fieldbus system according to claim 14, wherein the carrier module comprises a detent opening for inserting a locking shaft, in order to secure a fieldbus module on the carrier module.

19. Modular fieldbus system according to claim 18, wherein the carrier module comprises a first and a second detent opening for a left-side fieldbus module and a first and a second detent opening for a right-side fieldbus module.

20. Modular fieldbus system according to claim 19, wherein the carrier module has a rectangular base area in cross section and the first detent opening for the left-side fieldbus module is arranged in a first corner, the second detent opening for the left-side fieldbus module is arranged in a second corner, the first detent opening for the right-side fieldbus module is arranged in a third corner and the second detent opening for the right-side fieldbus module is arranged in a fourth corner.

21. Modular fieldbus system according to claim 14, wherein the first plug connector comprises a first low voltage plug connector, a first extra low voltage plug connector and a first data plug connector and the second plug connector comprises a second low voltage plug connector, a second extra low voltage plug connector and a second data plug connector.

22. Modular fieldbus system according to claim 21, wherein the low voltage plug connector, the first extra low voltage plug connector and the first data plug connector are arranged in a first row on a first side of the fieldbus module and the second low voltage plug connector, the second extra low voltage plug connector and the second data plug connector are arranged in a second row on a second side of the fieldbus module.

23. Modular fieldbus system according to claim 14, wherein the fieldbus module comprises a locking shaft for inserting into a detent opening in the carrier module, in order to secure the fieldbus module on the carrier module.

24. Modular fieldbus system according to claim 23, wherein the fieldbus module comprises a first locking shaft and a second locking shaft for a left-side carrier module and a first locking shaft and a second locking shaft for a right-side carrier module.

25. Modular fieldbus system according to claim 24, wherein the fieldbus module has a rectangular base area in cross section and the first locking shaft for the left-side carrier module is arranged in a first corner, the second locking shaft for the left-side carrier module is arranged in a second corner, the first locking shaft for the right-side carrier module is arranged in a third corner and the second locking shaft for the right-side carrier module is arranged in a fourth corner.

26. Modular fieldbus system according to claim 23, wherein the locking shaft can be rotated by a locking lever between a release position to release the fieldbus module and a locking position to lock the fieldbus module.

\* \* \* \* \*